United States Patent
Taylor et al.

(10) Patent No.: US 6,803,557 B1
(45) Date of Patent: Oct. 12, 2004

(54) PHOTODIODE HAVING VOLTAGE TUNABLE SPECTRAL RESPONSE

(75) Inventors: Scott M. Taylor, Goleta, CA (US); Kenneth Kosai, Goleta, CA (US); James A. Finch, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/256,835

(22) Filed: Sep. 27, 2002

(51) Int. Cl.⁷ .............................................. H01L 31/00

(52) U.S. Cl. .................................. 250/214.1; 250/208.1

(58) Field of Search ......................... 250/214.1, 208.1, 250/226; 257/55

(56) References Cited

U.S. PATENT DOCUMENTS

| | | | |
|---|---|---|---|
| 3,924,150 A | * 12/1975 | Wasa et al. | 327/514 |
| 4,847,489 A | * 7/1989 | Dietrich | 250/208.1 |
| 5,113,076 A | 5/1992 | Schulte | 250/370.06 |
| 5,466,953 A | 11/1995 | Rosbeck et al. | 257/185 |
| 5,731,621 A | 3/1998 | Kosai | 257/440 |
| 5,751,005 A | 5/1998 | Wyles et al. | 250/370.06 |
| 5,880,510 A | 3/1999 | Cockrum et al. | 257/442 |
| 5,936,268 A | 8/1999 | Cockrum et al. | 257/188 |
| 5,959,339 A | 9/1999 | Chapman et al. | 257/440 |

OTHER PUBLICATIONS

Stiebig et al., "Transiet Behavior of Optimized Nipiin Three-Color Detectors", IEEE Transactions on Electron Devices, vol. 45, No. 7, Jul. 1998.

Bruggemann et al., "The Operational Principle of a New Amorphous Silicon Based p–i–i–n Color Detector", J. Appl. Phys. vol. 81, No. 11, Jun. 1997.

* cited by examiner

Primary Examiner—Thanh X. Luu
(74) Attorney, Agent, or Firm—William C. Schubert

(57) ABSTRACT

A photodetector (10) includes a substrate (12) having a surface; a first layer (14) of semiconductor material that is disposed above the surface, the first layer containing a first dopant at a first concentration for having a first type of electrical conductivity; and a second layer (16) of semiconductor material overlying the first layer. The second layer contains a second dopant at a second concentration for having a second type of electrical conductivity and forms a first p-n junction (15) with the first layer. The second layer is compositionally graded through at least a portion of a thickness thereof from wider bandgap semiconductor material to narrower bandgap in a direction away from the p-n junction. The compositional grading can be done in a substantially linear fashion, or in a substantially non-linear fashion, e.g., in a stepped manner. Preferably the first dopant concentration is at least an order of magnitude greater than the second concentration, and more preferably is at least two orders of magnitude greater. When the first p-n junction is reverse biased, a depletion region (17) exists substantially only within the second layer, and varying the magnitude of the reverse bias shifts the wavelength at which a maximum spectral sensitivity or responsiveness is obtained. At least one electrical contact is provided for coupling the second layer to a source (32) of variable bias voltage for reverse biasing the p-n junction. As the magnitude of the bias voltage is changed a wavelength of electromagnetic radiation to which the photodetector is responsive is thus changed. An alternating current signal can be superimposed on the reverse DC bias voltage and a synchronous detection technique used to detect photons corresponding to a certain bandgap energy.

13 Claims, 15 Drawing Sheets

DEPTH
COMPOSITION PROFILE

DEPTH
DOPING PROFILE

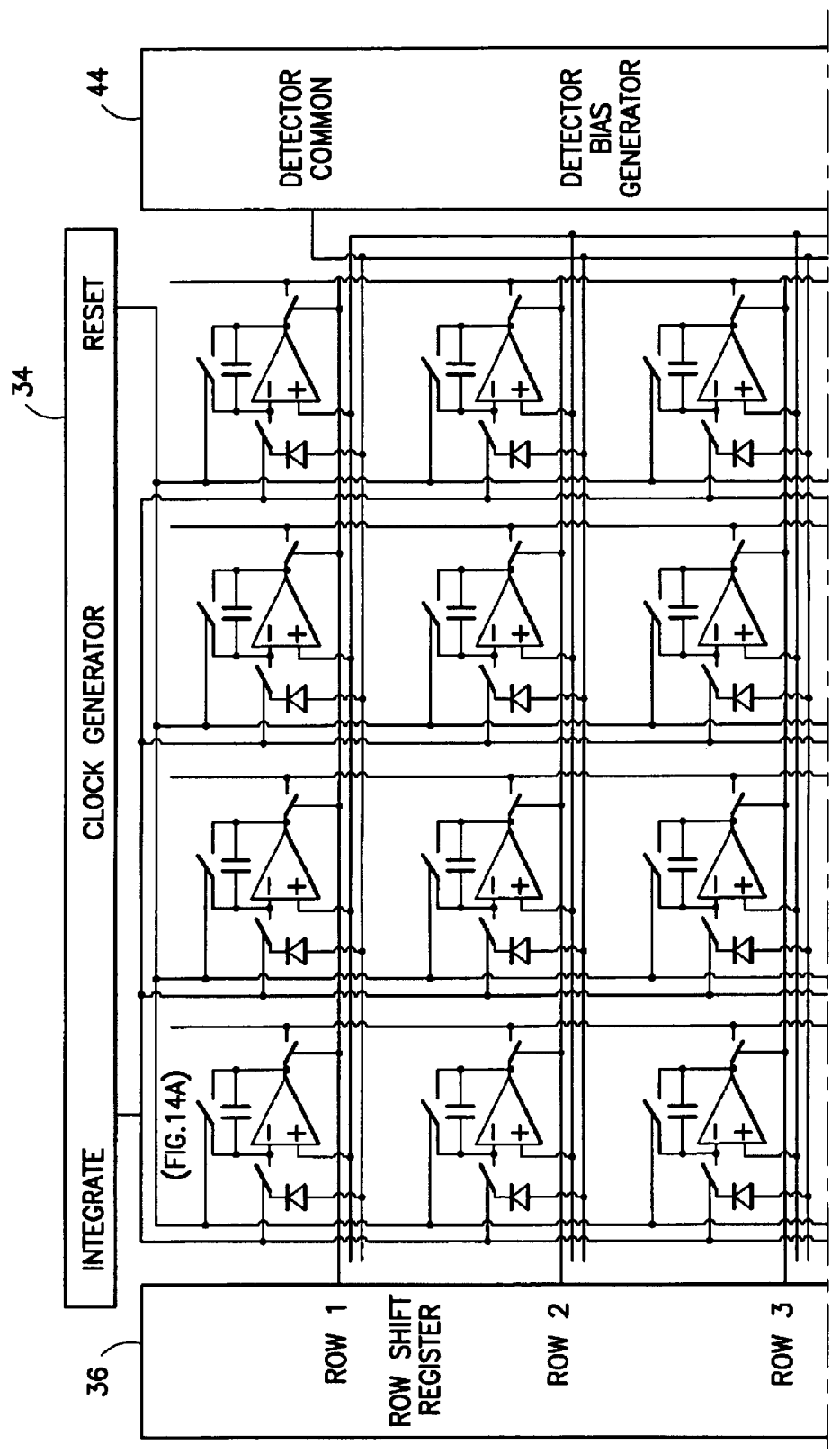

PHOTODIODE HAVING VOLTAGE TUNABLE SPECTRAL RESPONSE

TECHNICAL FIELD

These teachings relate generally to detectors of electromagnetic radiation and, more specifically, relate to photodiode detectors that are responsive to electromagnetic radiation in more than one spectral band. Even more specifically, these teachings relate to detectors of electromagnetic radiation that have an electrically tunable response to light of different wavelengths.

BACKGROUND

Electromagnetic radiation detectors that are responsive to light in more than one wavelength band, also referred to as multi-spectral or multi-color detectors, provide a number of advantages in modern imaging systems. In general, the light that is detected may be visible light or light that is not visible to the human eye (e.g., infrared (IR) radiation).

Early efforts to detect IR radiation within more than one spectral band have relied on the use of multiple detector arrays, each having a different spectral filter. Multiple detector arrays with different spectral responses have also been used. The use of a continuously variable wedge filter in conjunction with a detector array is also known in the art, as is the use of a mechanical spectral filter selector. For reasons related at least to increased cost, complexity and weight, these conventional approaches to multi-spectral imaging are disadvantageous for many applications.

It was thus realized that the detection of IR radiation in two or more spectral bands with a single integrated detector device was a very desirable alternative to the conventional approaches. Representative examples of such detectors can be found in the following commonly assigned U.S. Patents.

In U.S. Pat. No. 5,113,076 by Eric Schulte, "Two terminal multi-band infrared radiation detector", there is described a radiation detector that includes a first heterojunction and a second heterojunction that are electrically coupled together in series between a first electrical contact and a second electrical contact. The detector contains at least a three regions or layers, including a first layer having a first type of electrical conductivity, a second layer having a second type of electrical conductivity and a third layer having the first type of electrical conductivity. The first and second heterojunctions are coupled in series and function electrically as two back-to-back diodes. During use the detector is coupled to a switchable bias source that includes a source of positive bias (+Vb) and a source of negative bias (−Vb). With +Vb applied across the detector the first heterojunction is in far forward bias and functions as a low resistance conductor, thereby contributing no significant amount of photocurrent to the circuit. The second heterojunction is in a reverse bias condition and modulates the circuit current in proportion to the photon flux of an associated spectral region or color. Conversely, with −Vb applied across the detector the second heterojunction is in forward bias and contributes no significant photocurrent to the circuit while the first heterojunction is reversed biased and produces a current modulation proportional to the incident flux, where the flux is associated with a different spectral region.

In U.S. Pat. No. 5,731,621 to Kenneth Kosai, "Three band and four band multispectral structures having two simultaneous signal outputs", there is described a solid state array that has a plurality of radiation detector unit cells, wherein each unit cell includes a bias-selectable two color photodetector in combination with either a second bias-selectable two color detector or a single photodetector. Each unit cell is thus capable of simultaneously outputting charge carriers resulting from the absorption of electromagnetic radiation within two spectral bands that are selected from one of four spectral bands or three spectral bands.

In U.S. Pat. No. 5,751,005 by Richard Wyles et al., "Low-crosstalk column differencing circuit architecture for integrated two-color focal plane arrays", there is described an integrated two-color staring focal plane array having rows and columns of photodetector unit cells, each of which is capable of simultaneously integrating photocurrents resulting from the detection of two spectral bands. A readout circuit performs a subtraction function, and includes a differential charge-sensing amplifier in a one-per-column arrangement. The amplifier works in cooperation with circuitry located in each unit cell. The subtraction function is employed to create a separate Band1 signal from a Band2 and (Band1+Band2) signals generated by each simultaneous two-color detector. The circuit offers low spectral crosstalk between the two spectral bands.

Also by example, in U.S. Pat. No. 5,959,339 by Chapman et al., "Simultaneous two-wavelength p-n-p-n infrared detector" there is disclosed an array that contains a plurality of radiation detectors. Each radiation detector includes a first photoresponsive diode (D1) having an anode and a cathode that is coupled to an anode of a second photoresponsive diode (D2). The first photoresponsive diode responds to electromagnetic radiation within a first band of wavelengths and the second photoresponsive diode responds to electromagnetic radiation within a second band of wavelengths. Each radiation detector further includes a first electrical contact that is conductively coupled to the anode of the first photoresponsive diode; a second electrical contact that is conductively coupled to the cathode of the first photoresponsive diode and to the anode of the second photoresponsive diode; and a third electrical contact that is conductively coupled to a cathode of each second photoresponsive diode of the array. The electrical contacts are coupled during operation to respective bias potentials. The first electrical contact conducts a first electrical current induced by electromagnetic radiation within the first predetermined band of wavelengths, and the second electrical contact conducts a second electrical current induced by electromagnetic radiation within the second predetermined band of wavelengths, less an electrical current induced by electromagnetic radiation within the first predetermined band of wavelengths.

The disclosures of these various commonly assigned U.S. Patents are incorporated by reference herein in so far as there is no conflict with the teachings of this invention.

Also of interest to the teachings of this invention is a p-i-i-n (p-type, intrinsic, intrinsic, n-type) detector that is described by Brüaggermann et al., "The operational principle of a new amorphous silicon based p-i-i-n color detector", J. Appl. Phys. 81(11), 1 Jun. 1997, 7666–7672. The device is constructed using two large band gap front layers of doped and intrinsic hydrogenated amorphous silicon carbide (a-SiC:H), followed by an intrinsic and a doped a-Si:H layer. These authors report that by band gap engineering an experimental red response is maximized at a large reverse bias voltage, whereas the green response has its maximum at low reverse bias voltage. The potential profile of the p-i-i-n structure is said to be of crucial importance to the color detection mechanism. At larger wavelengths the large potential drop across the two highly defective front layers assists recombination in the back part of the device, which leads to the drop in the red response at low reverse voltage. For the voltage-dependent shift in spectral sensitivity it is said to be important that photogenerated carriers, under green bias illumination, are lost by recombination in the front part of the device.

Also of interest is an n-i-p-i-i-n detector of a type described by H. Stiebig et al., "Transient Behavior of Optimized nipiin Three-Color Detectors", IEEE Transactions on Electron Devices, Vol. 45, No. 7, July 1998, 1438–1444. These authors report the detection of the fundamental components of visible light (blue, green, red) with a multi-spectral two-terminal photodiode that is based on amorphous silicon. The preferential carrier collection region of the two-terminal device shifts upon a change of the applied bias voltage, which leads to a color sensitivity. Structures with controlled bandgap and mobility-lifetime product exhibit a dynamic behavior above 96 dB. Three linearly independent spectral response curves can be extracted to generate a RGB (red-green-blue)-signal. Bias voltage switching experiments under different monochromatic illumination conditions were carried out to investigate the time-dependent behavior.

SUMMARY OF THE PREFERRED EMBODIMENTS

The foregoing and other problems are overcome, and other advantages are realized, in accordance with the presently preferred embodiments of these teachings.

A photodetector in accordance with the teachings of this invention includes a substrate having a surface; a first layer of semiconductor material that is disposed above the surface, the first layer containing a first dopant at a first concentration for having a first type of electrical conductivity; and a second layer of semiconductor material overlying the first layer. The second layer contains a second dopant at a second concentration for having a second type of electrical conductivity and forms a first p-n junction with the first layer. The second layer is compositionally graded through at least a portion of a thickness thereof from wider bandgap semiconductor material to narrower bandgap in a direction away from the p-n junction. The compositional grading can be done in a substantially linear fashion, or in a substantially non-linear fashion, e.g., in a stepped manner. Preferably the first dopant concentration is at least an order of magnitude greater than the second concentration, and more preferably is at least two orders of magnitude greater. When the first p-n junction is reverse biased, a depletion region exists substantially only within the second layer, and varying the magnitude of the bias shifts the wavelength at which a maximum spectral sensitivity or responsiveness is obtained. At least one electrical contact is provided for coupling the second layer to a source of variable bias voltage for reverse biasing the p-n junction. As the magnitude of the bias voltage is changed a wavelength of electromagnetic radiation to which the photodetector is responsive is changed.

As examples, the semiconductor material can be selected from a Group II–VI material or from a Group III–V material. The first type of electrical conductivity can be p-type, and the second type of electrical conductivity can be n-type, or the first type of electrical conductivity can be n-type, and the second type of electrical conductivity can be p-type.

The photodetector can further include a third layer of semiconductor material that is disposed above the second layer, the third layer containing a third dopant at a third concentration for having the first type of electrical conductivity and a fourth layer of semiconductor material overlying the third layer. The fourth layer contains a fourth dopant at a fourth concentration for having the second type of electrical conductivity and forming a second p-n junction with the third layer, the fourth layer being compositionally graded through at least a portion of a thickness thereof from wider bandgap semiconductor material to narrower bandgap semiconductor material in a direction away from the second p-n junction. The third concentration is at least an order of magnitude greater than the fourth concentration, and when the second p-n junction is reverse biased a depletion region exists substantially only within the fourth layer.

Also disclosed is an array of IR radiation responsive photodetectors wherein each photodetector includes a photodiode having a p-n junction. A wavelength at which a maximum spectral response of the photodiode occurs is determined at least in part by a magnitude of a reverse bias voltage applied to the p-n junction. Each of the photodiodes includes a layer of semiconductor material that is compositionally graded from wider bandgap material towards narrower bandgap material in a direction away from the p-n junction. The compositionally graded layer confines substantially all of a depletion region of the photodiode.

A method is also disclosed for operating an array of electromagnetic radiation responsive photodetectors. The method includes providing the array such that each photodetector includes a photodiode having a p-n junction, where a wavelength at which a maximum spectral response of the photodiode occurs is determined at least in part by a magnitude of a reverse bias voltage applied across the p-n junction. Each of the photodiodes includes a layer of semiconductor material that is compositionally graded from wider bandgap material towards narrower bandgap material in a direction away from the p-n junction, where the layer confines substantially all (e.g., preferably more than about 95%, and more preferably more than about 99%) of a depletion region of the photodiode. During operation of the array the method establishes for each photodetector a predetermined magnitude of reverse bias voltage; and detects a signal generated from each photodetector that results from incident electromagnetic radiation having wavelengths that correspond to the maximum spectral response that is determined at least in part by the magnitude of the reverse bias voltage. The step of establishing may establish approximately the same magnitude of reverse bias voltage for each photodetector of the array, or it may establish approximately the same magnitude of reverse bias voltage for some of the photodetectors of the array while establishing at least one different magnitude of reverse bias voltage for other photodetectors of the array, or the step of establishing may establish a different magnitude of reverse bias voltage for each photodetector of the array. For a case where the array contains rows and columns of photodetectors, the step of establishing may establish a different magnitude of reverse bias voltage for individual ones of rows or columns of the array. The step of establishing can include varying the magnitude of the reverse bias potential during operation of the array. For a case where the layer of semiconductor material is compositionally graded in a stepped fashion, increments of reverse bias voltage can have a magnitude that is related to the steps.

An alternating current signal can be superimposed on the reverse DC bias voltage and a synchronous detection technique used to detect photons corresponding to a certain bandgap energy.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

Figure 1:
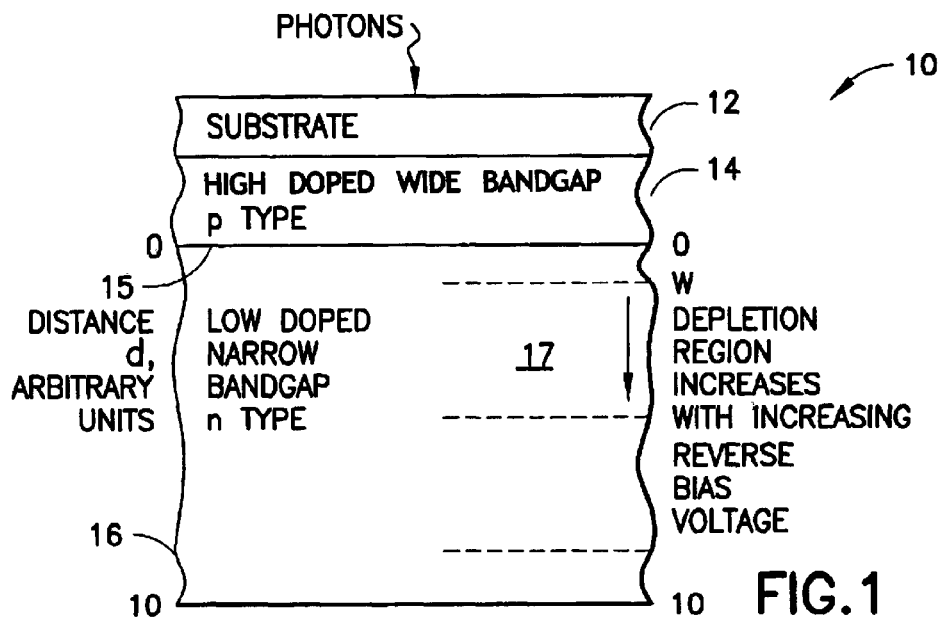
FIG. 1 is a simplified cross-sectional view of a photodiode that is constructed in accordance with the teachings of this invention.
Figure 2:
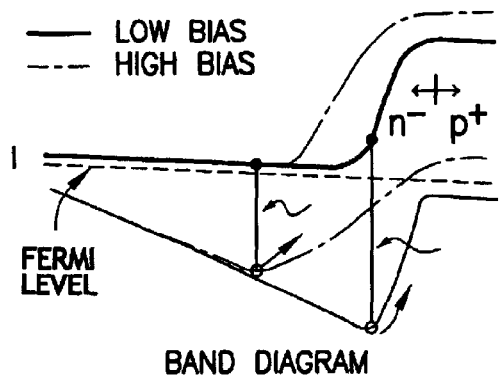
FIG. 2 is an energy band diagram that corresponds to the photodiode shown in FIG. 1.
Figure 3B:
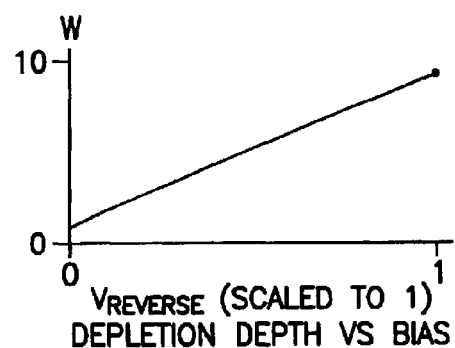
FIGS. 3A, 3B and 3C are graphs depicting the composition profile, depletion depth vs. bias, and spectral cutoff vs. bias for the photodiode shown in FIG. 1.
Figure 3A:
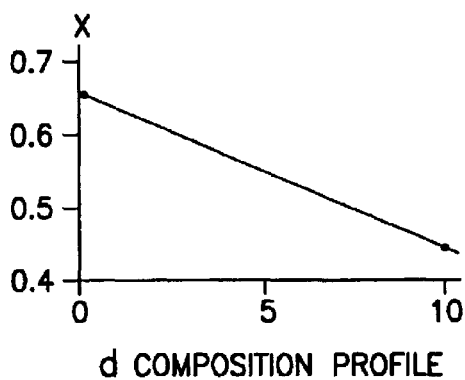
Figure 3C:
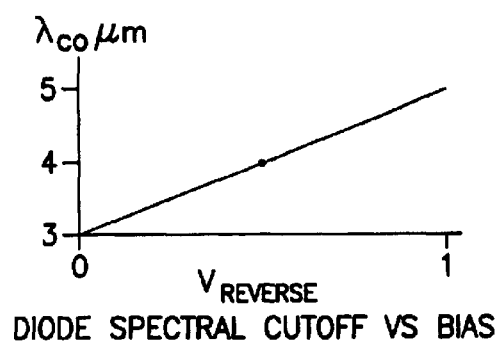

Referring to the photodetector 10 shown in cross-section in FIG. 1, and to the bandgap diagram of FIG. 2, in accordance with the teachings of this invention a highly doped wide bandgap p-type $Hg_{(1-x)}Cd_xTe$ layer 14 is grown on a substantially transparent (at the wavelengths of interest) substrate 12. The layer 14 may be doped p-type using, for example, Arsenic (As) having a concentration of about $10^{18}$ $cm^3$. The substrate 12 could be a suitable type of Group II–VI substrate, such as a CdTe substrate, or it could be a Silicon or other type of substrate having appropriate accommodation and/or lattice matching layers grown thereon, if required. A lightly doped n-type $Hg_{(1-x)}Cd_xTe$ layer 16 is grown over the p-type layer 14, wherein the value of x is varied from a higher value (wider bandgap) to a lower value (narrower bandgap) in a direction away from the p-type layer 14, as shown in FIG. 3A. By so varying the value of x during layer growth the n-type layer 16 is compositionally graded through at least a portion of its thickness. The layer 16 may be doped n-type using, as an example, Indium (In) having a concentration in a range of about $1\times10^{14}$ $cm^3$ to about $3\times10^{14}$ $cm^3$. Molecular Beam Epitaxy (MBE) is a presently preferred layer growth technique, although other layer growth techniques, such as Liquid Phase Epitaxy (LPE) or Vapor Phase Epitaxy (VPE), could be used as well. The resulting layers 14 and 16 form a p-n junction 15 where, because of the difference in the doping concentrations of layers 14 and 16 and the compositional grading profile of the n-type layer 16, the depletion region 17 is predominantly and substantially exclusively located within the n-type layer 16. When the p-n junction is reverse biased it is then observed that the depletion region 17 is driven progressively deeper into the n-type layer 16 as the magnitude of the reverse bias is increased, as shown in FIG. 3B. This tends to overcome the electric field caused by the composition gradient of the $Hg_{(1-x)}Cd_xTe$ layer 16, and photo-generated holes can be captured by the electric field in the depletion region 17, instead of recombining outside of the depletion region 17. Thus, increasing the magnitude of the reverse bias increases the spectral response cutoff wavelength of the p-n junction 15 of the photodetector 10, when illuminated through the substrate 12, as shown in FIG. 3C.

Representative, but not limiting, layer thicknesses are about 2–3 microns for p-type layer 14 and about 10–15 microns for the n-type layer 16.

It is noted that the compositional grading profile of the layer 16 is opposite to that most often encountered (i.e., where the composition x would be varied from a lower value (narrower bandgap) to a higher value (wider bandgap) in a direction away from the p-type layer 14 and towards a surface of the device.)

General reference in this regard can be made to U.S. Pat. No. 5,466,953 by Rosbeck and Cockrum, ADenuded zone field effect photoconductive detector@, where a compositionally graded HgCdTe radiation detector is constructed to have a high purity denuded zone that is formed adjacent to a radiation absorbing region. The compositional grading results in an internally generated electric field that is orthogonally disposed with respect to an externally generated electric field applied between contacts. The internally generated electric field has the effect of injecting photogenerated minority charge carriers into the denuded zone, thereby reducing recombination with photogenerated majority charge carriers and increasing carrier lifetime. The detector further includes a wider bandgap surface passivation region that functions to trap, or "getter", impurities from the denuded zone and also to reduce surface recombination effects.

Reference can also be made to U.S. Pat. No. 5,936,268 by Cockrum et al., AEpitaxial passivation of group II–VI infrared photodetectors@, where an array of photodiodes includes a radiation absorbing base layer of $Hg_{1-x}Cd_xTe$, where the value of x determines the responsivity of the array to either LWIR, MWIR or SWIR. The upper surface of the array is provided with a passivation layer comprised of an epitaxial layer of Group II–VI material which forms a heterostructure with the underlying Group II–VI material and which has a wider bandgap than the underlying $Hg_{1-x}Cd_xTe$, and which thereby repels both holes and electrons from the diode junctions.

Further reference can also be had to U.S. Pat. No. 5,880,510 by Cockrum et al., AGraded layer passivation of group II–VI infrared photodetectors@, where a Group II–VI IR photodiode has a passivation layer overlying at least exposed surfaces of a p-n diode junction. The passivation layer is a compositionally graded layer comprised of Group II atoms diffused into a surface of the p-n diode junction. The passivation layer has a wider energy bandgap than the underlying diode material thereby repelling both holes and electrons away from the surface of the diode and resulting in improved diode operating characteristics. In the passivation layer the energy bandgap gradually decreases in value as a function of depth from the surface until the bandgap energy equals that of the underlying bulk material.

In the instant photodiode 10 the compositional grading, from wider bandgap to narrower bandgap in a direction away from the p-n junction 15, in combination with the difference in doping concentrations between layers 14 and 16 (at least about one and preferably at least about two or more orders of magnitude), causes the depletion region to reside or be confined almost entirely within the n-type layer 16, and to grow or extend further into the layer 16 upon an increase in reverse bias, as opposed to growing into both the p-type layer 14 and the n-type layer 16. Suitable dopant concentrations for the p-type layer 14 can be from about $10^{17}$ atoms/cm$^3$ to about $10^{18}$ atoms/cm$^3$, and suitable dopant concentrations for the n-type layer 16 can be from about $3 \times 10^{14}$ atoms/cm$^3$ to about $3 \times 10^{15}$ atoms/cm$^3$. Generally speaking, and by example, the dopant concentration of the p-type layer 14 is greater by about two to three orders of magnitude than the dopant concentration of the n-type layer 16.

It should be appreciated that this growth technique and the electrical operation of the resulting photodetector 10 may be used with other variable composition semiconductor materials to vary the photosensitivity wavelength.

Figure 9:
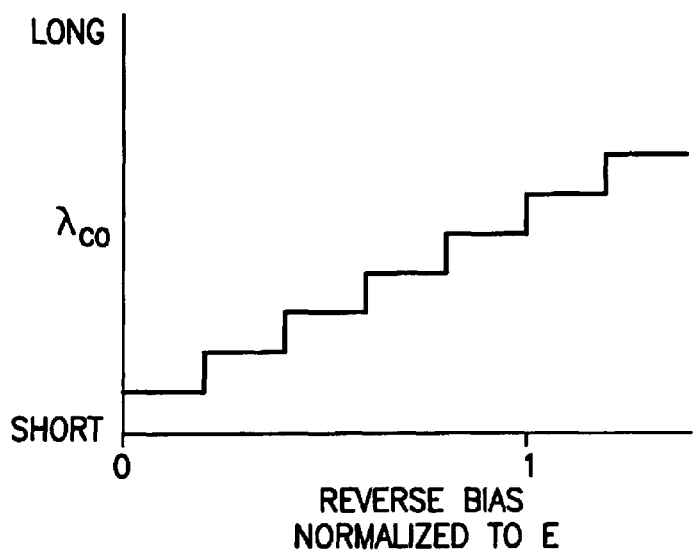
FIG. 9 illustrates a graph that depicts the spectral response vs. reverse bias (normalized to unity) for the stepped profile photodiode detector.
Figure 10A:
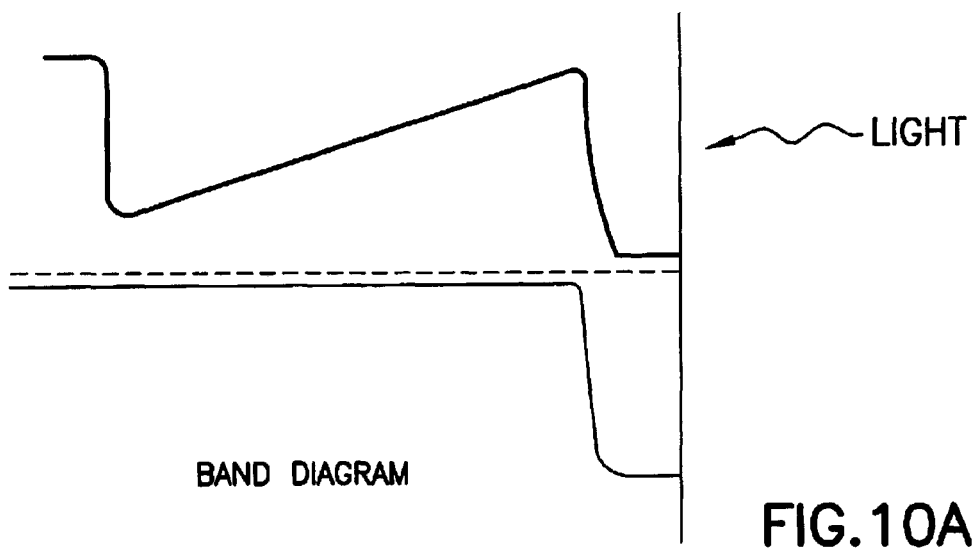
FIGS. 10A, 10B and 10C depict an energy band diagram, depth composition profile and depth doping profile, respectively, for a device fabricated using the opposite polarity (p on n) of semiconductor material to the embodiments described by FIGS. 1–9.
Figure 10B:
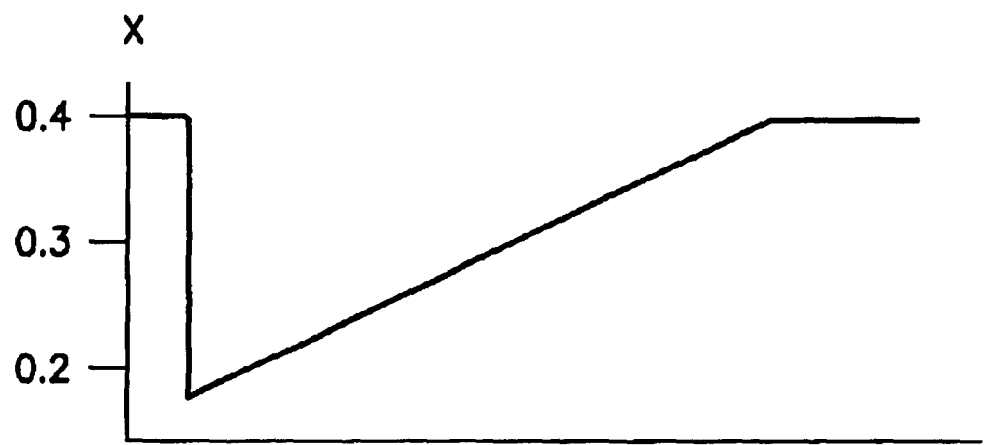
Figure 10C:
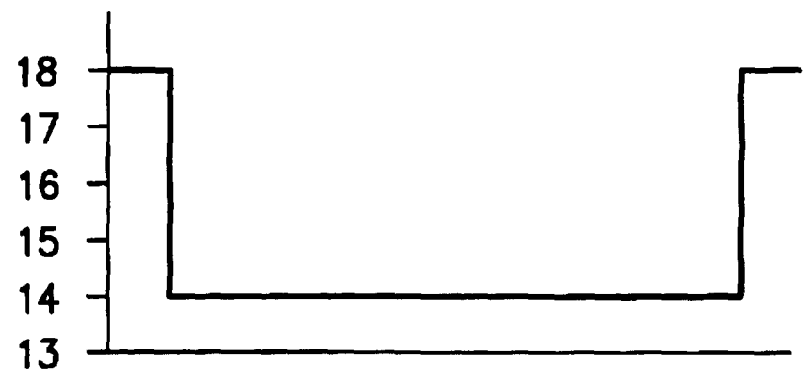

Furthermore, these teachings are not limited to the n-on-p photodetector 10 embodiment shown in FIG. 1. For example, FIGS. 10A, 10B and 10C depict an energy band diagram, depth composition profile and depth doping profile, respectively, for a device fabricated using the opposite polarity (p-on-n) of Group II–VI semiconductor material to the embodiment described by FIGS. 1, 2 and 3A–3C, as well as those described below in reference to FIGS. 4–9. In this case the n-type material is more heavily doped than the p-type material, and the compositional profile of the p-type material is graded.

In addition, these teachings may be applied to other than Group II–VI detectors of IR radiation. For example, these teachings may be applied as well to photodetectors constructed using Group III–V materials. Examples of III–V semiconductor materials that are suitable for supporting the bias tuneable bandgap in accordance with these teachings include, but need not be limited to, the following:

$Al_xIn_{(1-x)}P$
$Ga_xIn_{(1-x)}P$
$InP_xAs_{(1-x)}$
$Al_xGa_{(1-x)}As$
$Ga_xIn_{(1-x)}As$
$InAs_xSb_{(1-x)}$
$Al_xIn_{(1-x)}As$
$Ga_xIn_{(1-x)}Sb$
$InGaN$
$Al_xGa_{(1-x)}$
$SbGaP_xAs_{(1-x)}$
$Ga_xIn_{(1-x)}As_yP_{(1-y)}$
$Al_xIn_{(1-x)}Sb$
$GaAs_xSb_{(1-x)}$

Figure 13A:
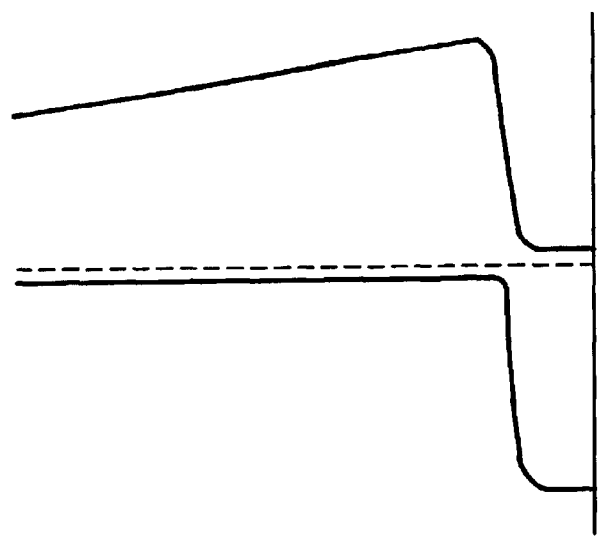
FIGS. 13A, 13B and 13C depict an energy band diagram, depth composition profile and depth doping profile for a device fabricated using a Group III–V material, specifically the material $Al_xGa_{(1-x)}As$ over the composition range for which it is a direct bandgap semiconductor.
Figure 13B:
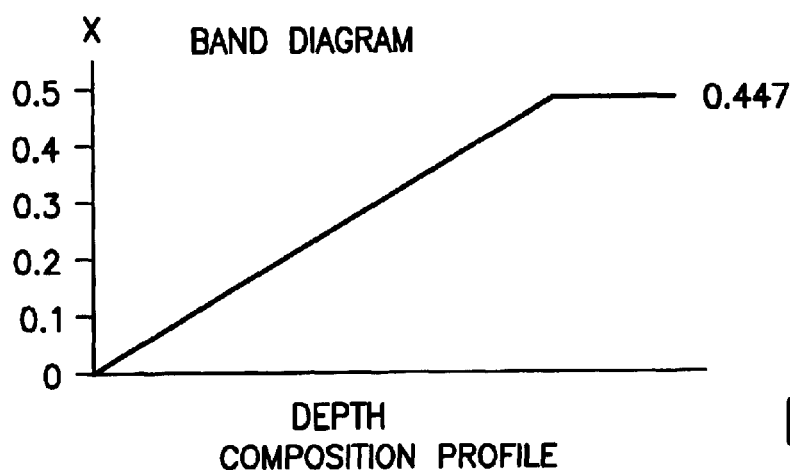
Figure 13C:
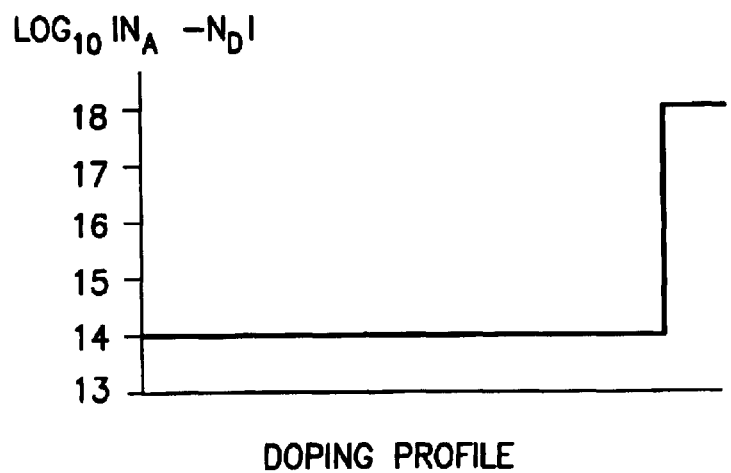

As but one example, FIGS. 13A, 13B and 13C illustrate an energy band diagram, depth composition profile and depth doping profile for a photodetector device fabricated using the material $Al_xGa_{(1-x)}As$ over the composition range for which it is a direct bandgap semiconductor. This device as well features the significant doping concentration difference across the p-n junction and the compositionally graded layer that cooperate to support the confinement and growth of the depletion region 17 within the more lightly doped layer under increasing reverse bias conditions.

By superimposing a smaller AC voltage on the DC bias voltage, the resulting AC diode current can be treated as a spectral bandpass signal. The magnitude of the AC voltage determines the spectral width of the bandpass. By sweeping the DC bias voltage, the spectral bandpass is then swept across a range of the IR spectrum. By using phase sensitive AC detection, such as synchronous detection techniques that are phase locked to the phase of the AC bias voltage, the signal-to-noise ratio (SNR) of the detector 10 may be significantly improved.

In this case a p-n junction has a graded composition in a low doped layer in which the depletion region can be pushed into increasingly narrower bandgap material as the reverse bias is increased. Synchronous detection of the small AC current resulting from the small AC bias that is superimposed on the swept DC reverse bias is used to obtain a variable spectral response to infrared photon stimulation.

In one non-limiting example a −1 volt DC bias has a 20 mV RMS, 1 kHz AC signal superimposed thereon. A synchronous detector is used to detect only the AC component, where the synchronous detector is phase and frequency locked to the AC component of the bias signal. The DC bias voltage can be held at a constant value, or it can be swept over a range of voltage values. In this aspect of the invention one essentially measures only those IR photons having an energy that corresponds to a bandgap energy that is related to the AC bias component and the present value of the DC bias.

Figure 4:
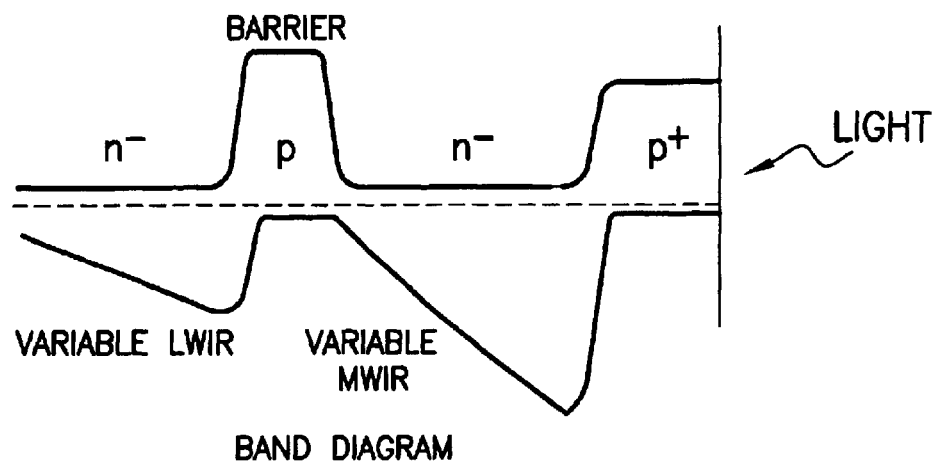
FIG. 4 is an energy band diagram of a multi-layer device with two independently tunable two color spectral responses.
Figure 5:
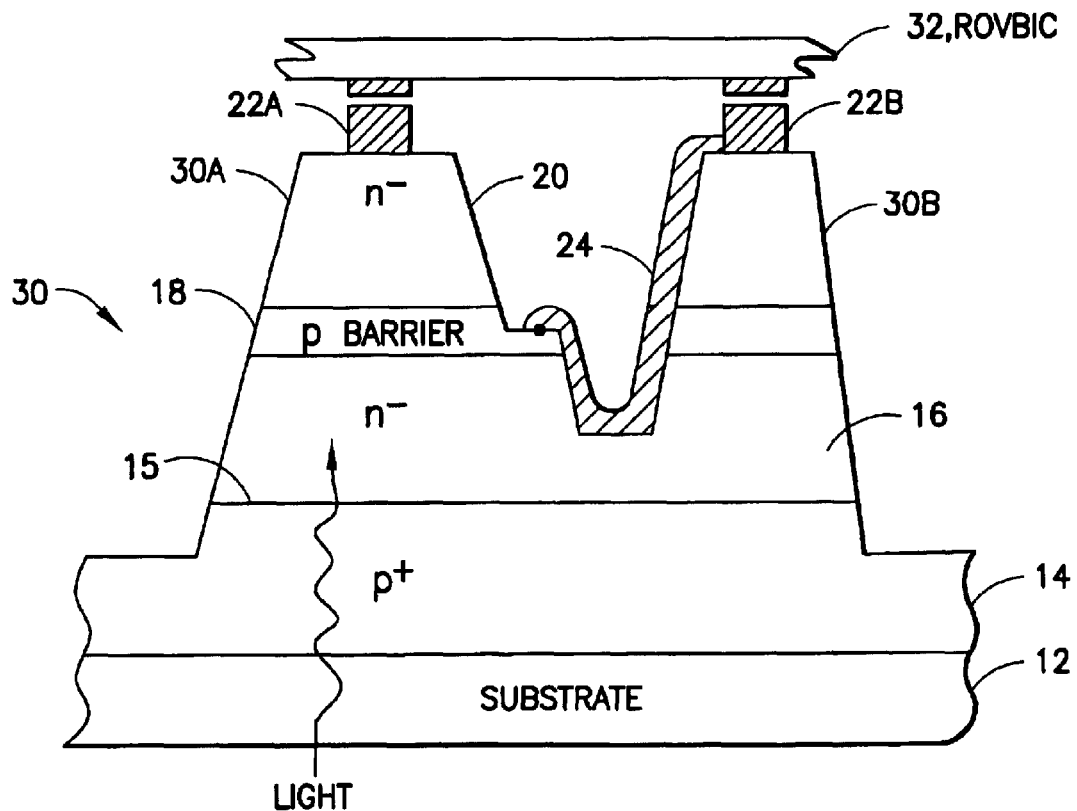
FIG. 5 is a simplified cross-sectional view of a tunable detector in accordance with the energy band diagram of FIG. 4.

A multilayer device with two independently tunable two color spectral responses may also be fabricated. For example, FIG. 4 is an energy band diagram of a multi-layer device with two independently tunable two color spectral responses (e.g., LWIR and MWIR), and FIG. 5 is a simplified cross-sectional view of a tunable detector 30 in accordance with the energy band diagram of FIG. 4. In FIG. 5 the substrate 12 and p+ layer 14 may be as described above for the photodetector 10 of FIG. 1, as may the n− layer 16. Representative, but not limiting, layer thicknesses are about 2–3 microns for p+ layer 14 and about 10–15 microns for the n− layer 16.

Over the n− layer 16 is then grown a p-type barrier layer 18, and then another compositionally graded n-type layer 20. Representative, but not limiting, layer thicknesses are about 2–3 microns for the p barrier layer 18 and about 10–15 microns for the n− layer 20. The resulting layered structure is photolithographically processed into pixel or unit cell mesa structures each comprised of a first, primary mesa 30A and a secondary mesa 30B. Suitable electrical contact pads and interconnects, such as Indium bumps 22A and 22B are then added. Indium bump 22A provides electrical contact for a readout and variable biasing integrated circuit (ROVBIC) 32. Metallization 24 provides an electrically conductive path from Indium bump 22B to the p barrier layer 18 contained with the primary mesa 30A wherein incident MWIR and LWIR radiation is detected. In this embodiment, as shown in FIG. 4, the detection wavelength of both the MWIR and the LWIR radiation is bias tuneable.

Figure 14A:
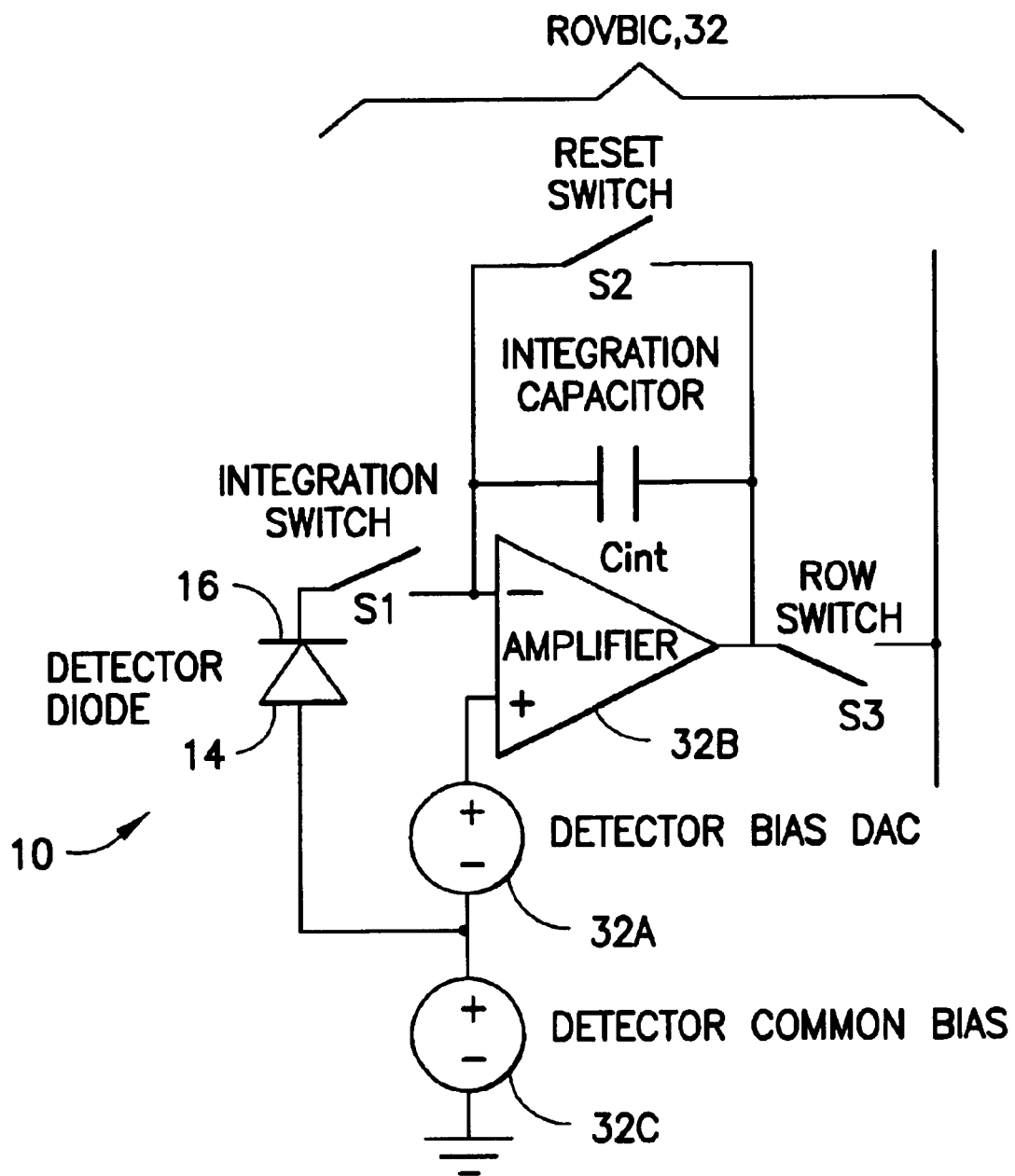
FIG. 14A is a simplified schematic diagram of a single photodetector unit cell coupled to a readout and variable bias integrated circuit.

FIG. 14A is a simplified schematic diagram of a single photodetector unit cell 10, as in FIG. 1, coupled to the ROVBIC 32. A Detector Common Bias 32C attaches to a ground ring of the detector array (shown more clearly in FIG. 15A), and sets the detector common voltage to a level that is optimum for a capacitance transimpedance amplifier (CTIA). A Detector Bias DAC (digital to analog converter) 32A sets the bias voltage on the detector diode 10 through the CTIA 32B, when an Integration Switch (S1) is closed. This bias voltage sets the spectral response of the detector array. The above-mentioned AC component of the bias voltage can be added by the DAC 32A by varying the input digital value at a rate and over a range of values to provide the desired AC modulation of the DC bias. The AC component would then also be provided to a synchronous detector enabling phase and frequency lock to the AC bias component. The DC bias voltage value can be varied or swept as well, as was also mentioned previously.

Figure 14B:
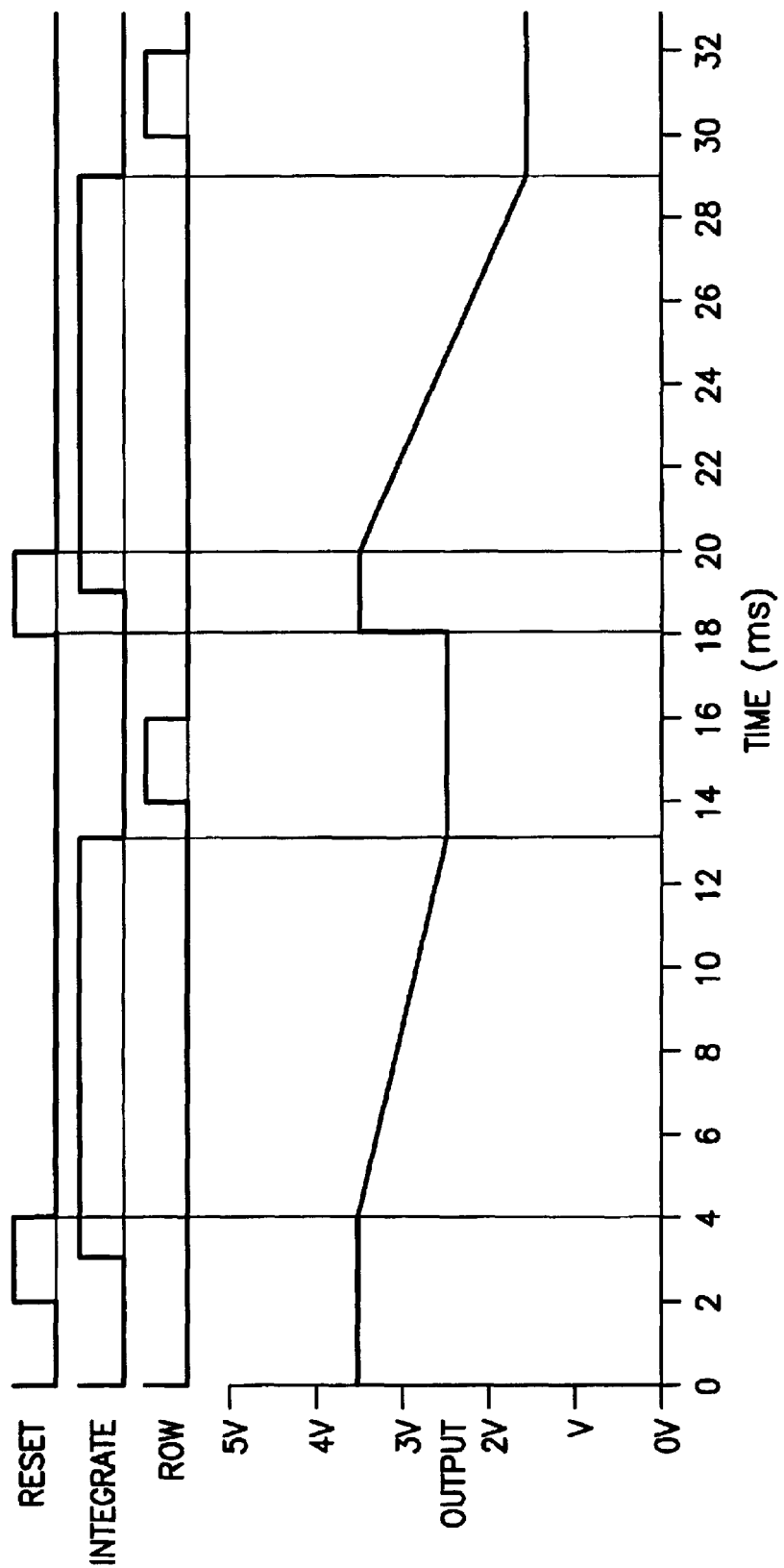
FIG. 14B is a timing diagram for the unit cell of FIG. 14A.

In operation, and referring also to FIG. 14B (which shows two integration periods), the Integration Switch S1 and a Reset Switch (S2) are closed, and a Row Switch (S3) is open. This puts the CTIA 32B into a unity gain mode, and the voltage produced by the Detector Bias DAC 32A appears across the Detector Diode 10. Then the Reset Switch S2 is released, and electrical charge from the Detector Diode 10 flows into an integration capacitor (Cint), since the charge cannot flow into the inverting input of the CTIA 32B. As the charge flows into Cint the voltage across it increases. However, the CTIA 32B operates to maintain its + and B inputs at the same voltage, which in this case is the voltage output by the Detector Bias DAC 32A. The result is that as charge continues to flow into Cint, the voltage on the output node of the CTIA 32B increases negatively. When the integration time is over, the Integration Switch S1 is opened. At some time later the Row Switch S3 is closed, and the output voltage of the CTIA 32B is output from the ROVBIC 32. The output waveform in FIG. 14B shows twice the amount of voltage change between 20 ms and 29 ms as between 4 ms and 13 ms. This would occur if the detector photo current were to double between the two integration periods.

Figure 6:
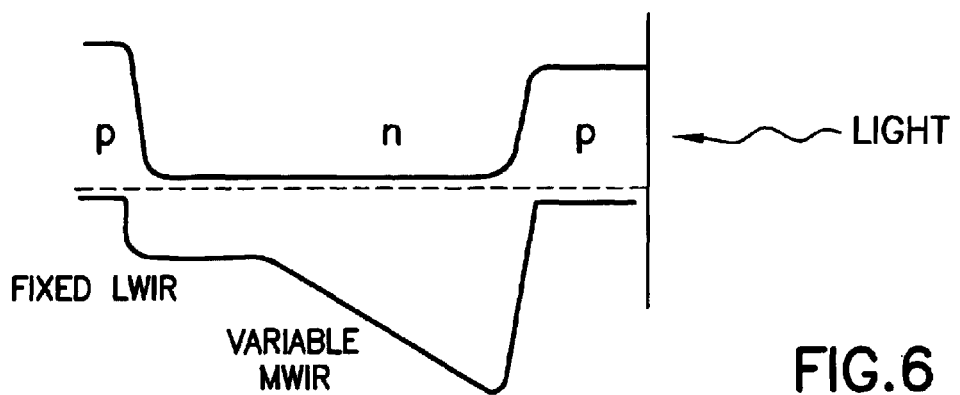
FIG. 6 is an energy band diagram of a detector having a fixed cut-off LWIR region and a variable cut-on LWIR region that is a function of a variable cut-off of an MWIR responsive region.

A photodetector device with a fixed cutoff LWIR and a variable LWIR Acuton@, depending on the variable cutoff of the MWIR, is shown in FIG. 6. Only one indium bump 22 per pixel is required for this embodiment, as opposed to the use of two Indium bumps 22A and 22B in FIG. 5. In essence, in this embodiment the secondary mesa 30B of FIG. 5 is eliminated.

Figure 7:
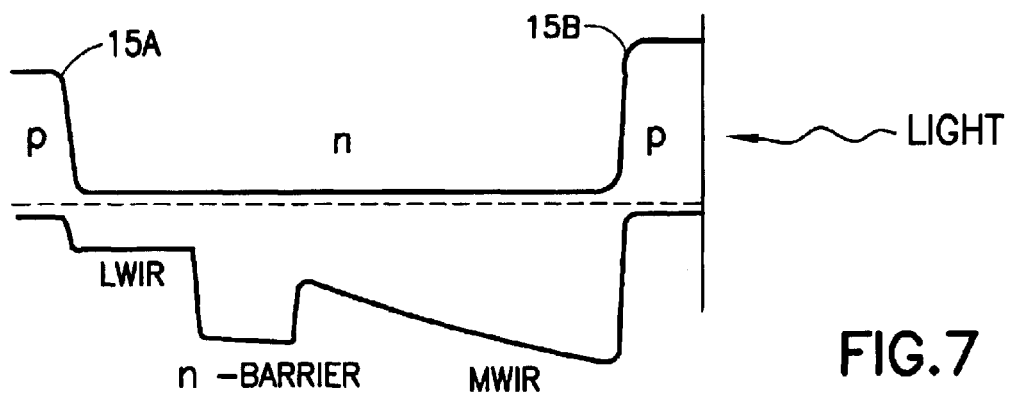
FIG. 7 is an energy band diagram of a detector having a fixed LWIR bandpass and a variable cut-off MWIR bandpass.

FIG. 7 is an energy band diagram of a detector having a fixed LWIR bandpass and a variable cut-off MWIR bandpass. In this embodiment the n-barrier prevents carriers generated to the right of it from reaching the LWIR junction when it is accessed. Only one Indium bump 22 per pixel is required. Applying a negative bias to the left terminal (the terminal opposite the entry of the light) with respect to the right terminal reverse biases the left p-n junction 15A and activates the LWIR mode. Applying a positive bias activates the right p-n junction 15B, with tuneable cutoff wavelength by varying the positive bias voltage.

Figure 8A:
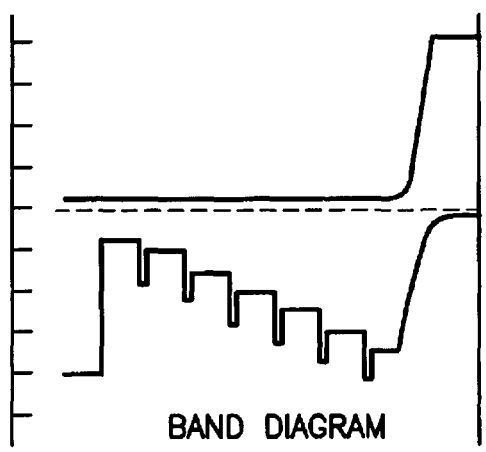
FIGS. 8A, 8B and 8C are graphs depicting the band diagram, depth composition profile and depth doping profile for a non-linear or stepped profile photodiode detector.
Figure 8B:
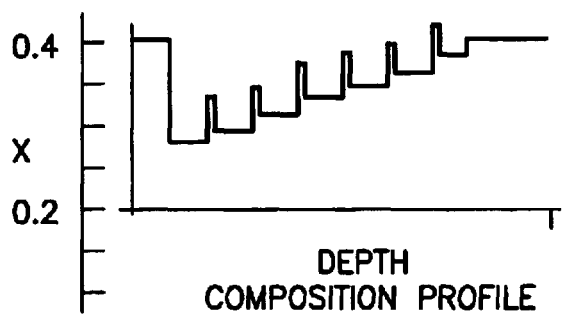
Figure 8C:
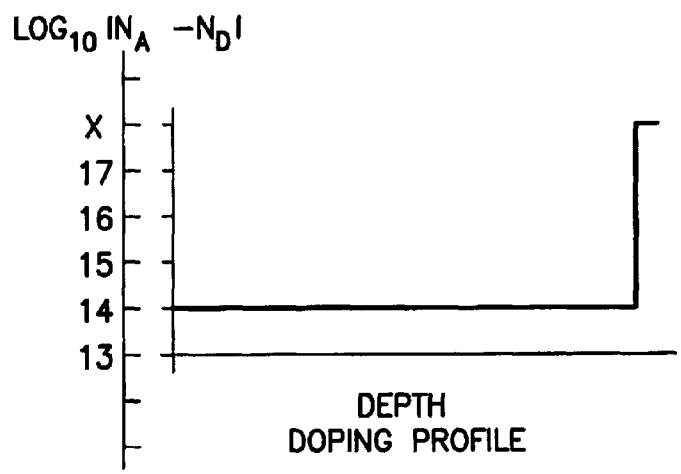

Any of the preceding structures that implement the compositional gradient may also employ the non-linear or step profile shown in FIGS. 8A–8C, where FIGS. 8A, 8B and 8C show the band diagram, the depth composition profile and the depth doping profile, respectively, for the stepped profile photodiode detector, as opposed to the smoothly graded or linear composition profile photodiode detector. FIG. 9 shows a graph that depicts the spectral response vs. reverse bias (normalized to unity) for the stepped profile photodiode detector. Each step in the composition of the n-type layer 16 is bounded on the left edge by a minority carrier reflector, to improve quantum efficiency. The resulting photodiode exhibits a stepped spectral cutoff response, and small variations of bias voltage does not affect the response. By varying the bias voltage between two steps, a spectral bandpass response results from the difference signal detected at each of the two steps. This embodiment gives the same spectral response across an array of detectors, even if the bias voltage varies a small amount between detectors, and/or if the depletion depth varies because of doping variations. A detector array fabricated with this step approach may be more producible, and may require less scene correction. In addition, the steps may be adjusted to make the detector sensitive to specific spectral bands or spectral cutoffs.

While the stepped structure illustrated in FIGS. 8A–8C and 9 may appear at first glance to be superficially similar to that of Brüggermann et al. (J. Appl. Phys. 81, 7666 (1997)), Brüggermann et al. did not rely on the barrier height of the isotype heterojunction to provide separation of photocarriers according to the wavelength of the absorbed light.

A two dimensional focal plane array 40 may be fabricated from any of the previously described structures. The array 40 may be biased uniformly so it responds uniformly in spectral response, as in FIG. 11A, or the spectral response may be electrically graded across the array 40, as in FIG. 11B. The graded response may be useful for scanning applications, as in FIG. 11C.

Figures 11A, 11B, 11C:
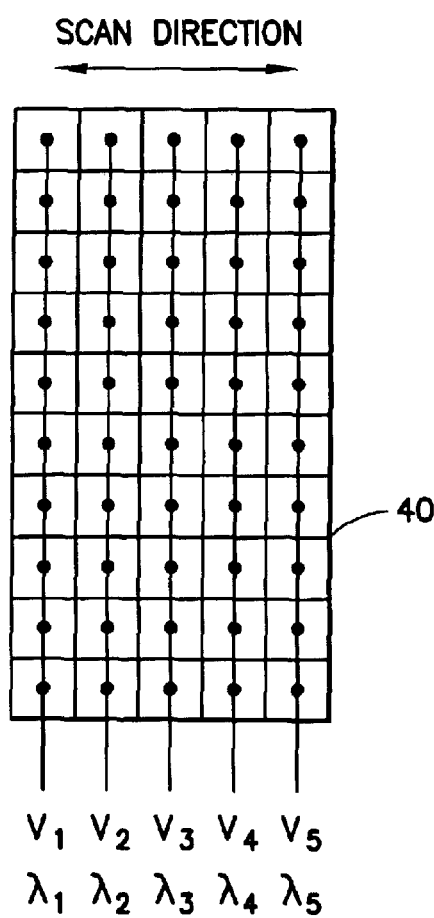
FIG. 11A is a simplified top view of a staring type photodetector array that is biased so as to provide a uniform spectral response indicated by wavelength $\lambda_1$.
FIG. 11B is a simplified top view of a staring type photodetector array that is biased so as to provide a bandpass response indicated by wavelengths $\lambda_1$, $\lambda_2$ and $\lambda_3$.
FIG. 11C is a simplified top view of a multi-column scanning array where each column is biased differently to provide a graded spectra response indicated by wavelengths $\lambda_1$, $\lambda_2$, $\lambda_3$, $\lambda_4$ and $\lambda_5$.

More specifically, FIG. 11A is a simplified top view of a staring type photodetector array 40 that is biased so as to provide a uniform spectral response indicated by wavelength $\lambda_1$.

An AC component may be applied to the detector substrate 12 to achieve a bandpass response. For example, FIG. 11B is a simplified top view of the staring type photodetector array 40 that is selectively biased so as to provide a bandpass response indicated by wavelengths $\lambda_1$, $\lambda_2$ and $\lambda_3$. FIG. 11C is a simplified top view of a multi-column scanning type of array 40, where each column is biased differently, indicated by voltages $V_1$, $V_2$, $V_3$, $V_4$ and $V_5$, to provide a graded spectral response indicated by wavelengths $\lambda_1$, $\lambda_2$, $\lambda_3$, $\lambda_4$ and $\lambda_5$, respectively. In this embodiment the scanning direction of the incident light is perpendicular to the columns, and each column is sensitive to a different range of wavelengths arriving from the scene being viewed. In other embodiments each row may be biased differently.

In general, in various embodiments in accordance with this invention each of n photodetectors of the array 40 could be reverse biased differently so as provide a maximum spectral response to individual ones of $\lambda_1$ through $\lambda_n$ different wavelengths. In another embodiment some of the photodetectors of the array could have a fixed spectral response, i.e., one that is not bias voltage tuneable, while others of the photodetectors of the array could have the adjustable spectral response, i.e., one that is bias voltage tuneable. In any of these embodiments the reverse bias voltage could be varied and then set prior to operation, or the reverse bias voltage may be varied during operation (for example at the frame rate or at a multiple of the frame rate).

Figure 12A:
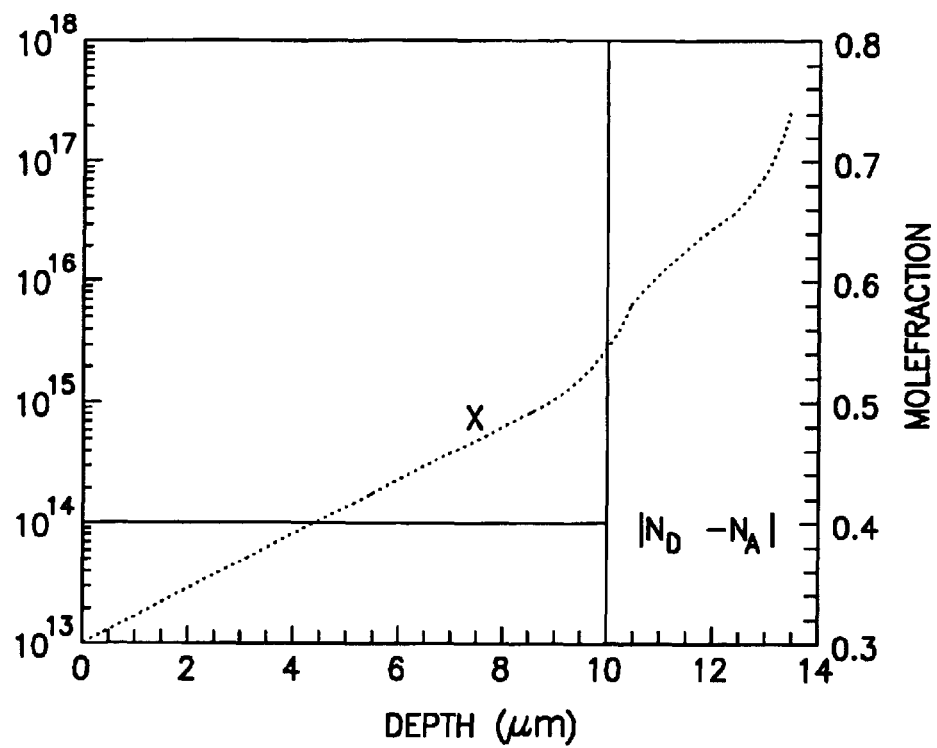
FIG. 12A is a graph that plots composition and doping profiles for an exemplary detector device.
Figure 12B:
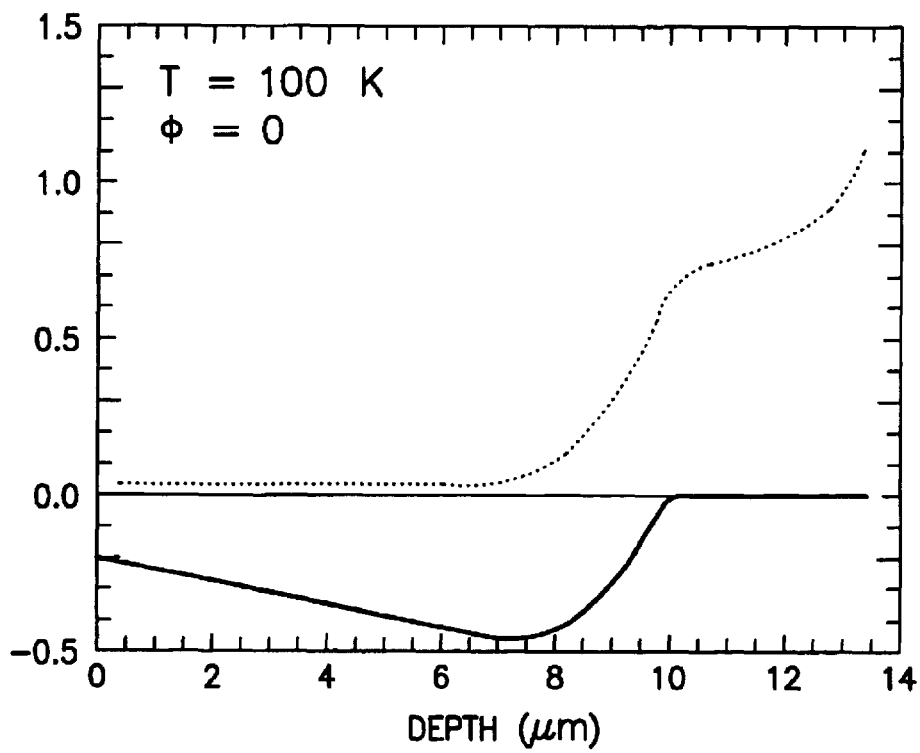
FIG. 12B illustrates the resulting energy band diagram and FIG. 12C shows the spectra response for two bias voltages.
Figure 12C:
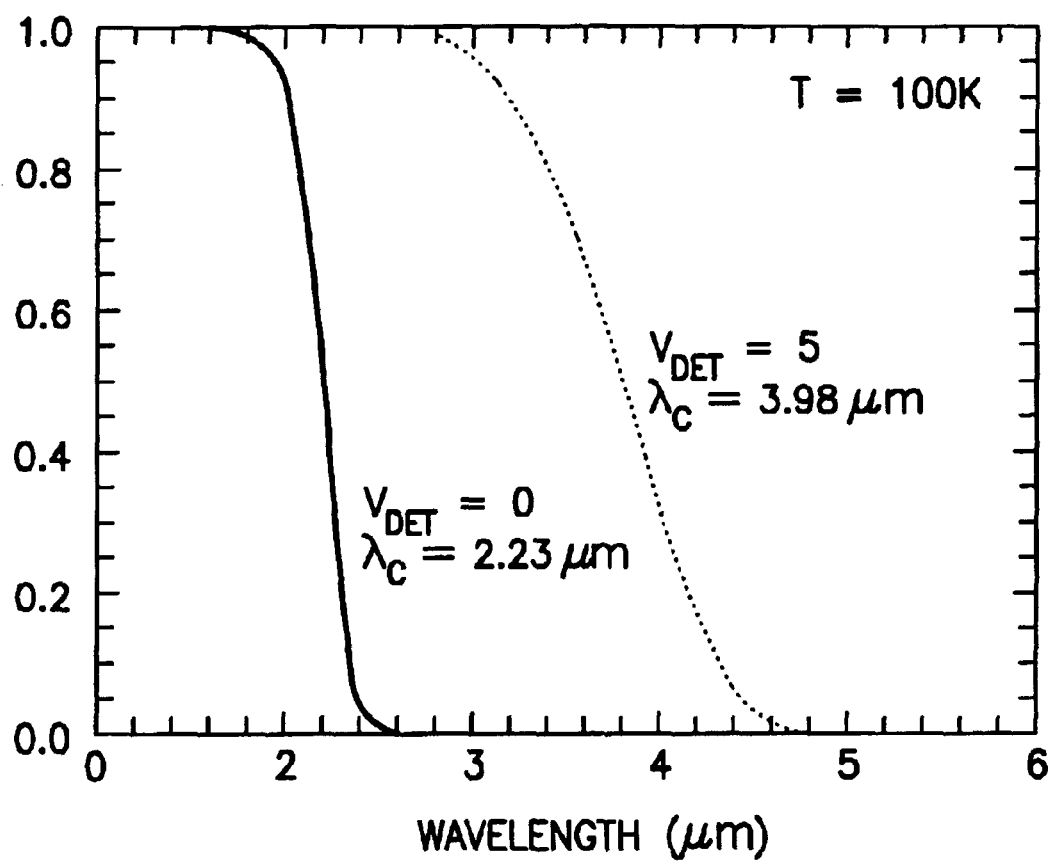

Reference is now made to FIG. 12A for showing a graph that plots composition and doping profiles for an exemplary photodetector constructed in accordance with these teachings, while FIG. 12B illustrates the resulting energy band diagram and FIG. 12C shows the spectral response for two different (and exemplary) bias voltages (i.e., $V_{DET}$=0 V then $\lambda_c$=2.23 µm and $V_{DET}$=5 V then $\lambda_c$=3.98 µm).

Figure 15A:
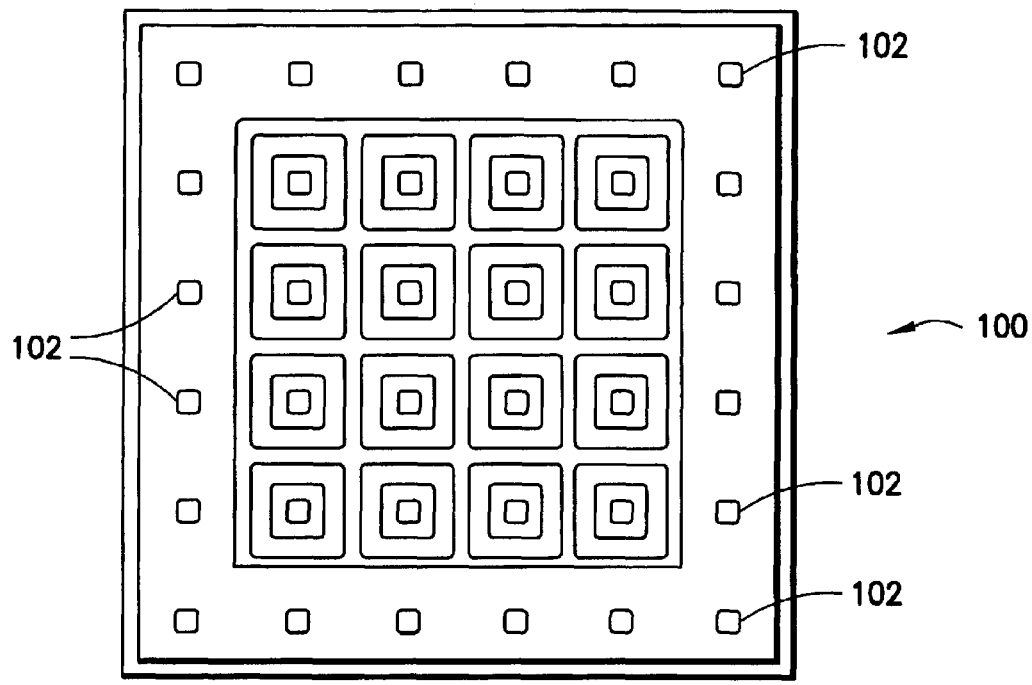
FIG. 15A is an enlarged top view of an exemplary 4×4 unit cell detector array.
Figure 15B:
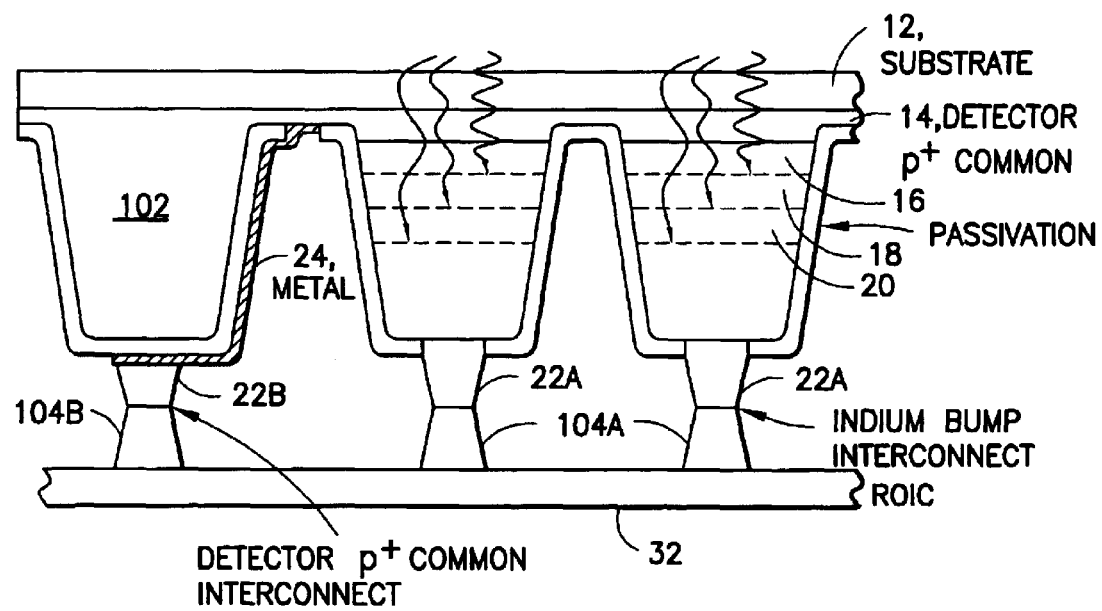
FIG. 15B is an enlarged cross-sectional view of a portion of the array of FIG. 15A.

An exemplary 4×4 detector array 100 may be fabricated as shown in FIGS. 15A and 15B. The 4×4 array of pixels are surrounded by a ring of ground contacts 102 to the detector common p+ layer 14. The detector array 100 may be connected to the readout integrated circuit (ROIC), or ROVBIC 32 in this case, with the indium bumps 22A that mate with corresponding bumps 104A. The ground contacts 102 mate with corresponding bumps 104B.

Figure 16B:
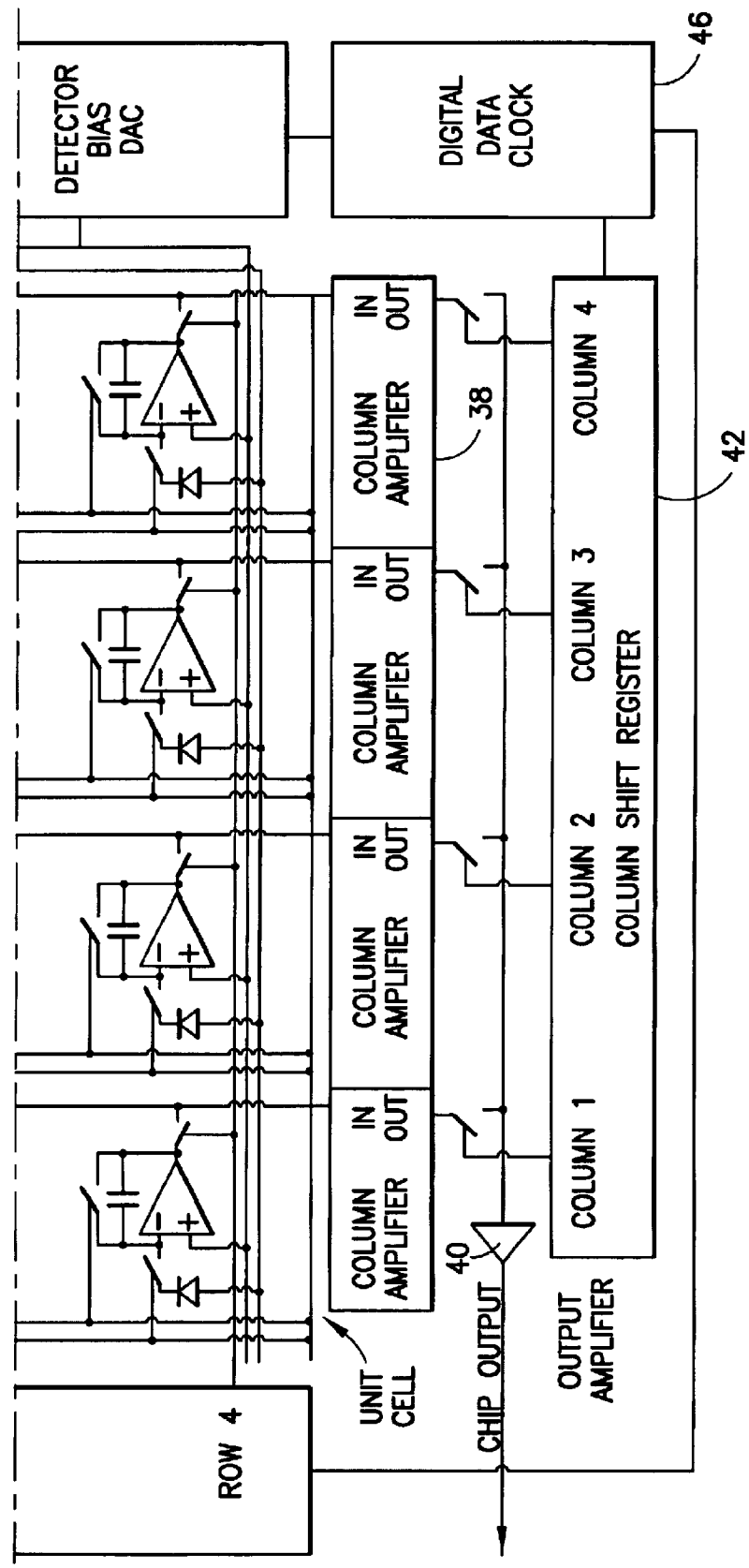
FIG. 16 is a block diagram, partly in schematic diagram form, of the 4×4 array of FIGS. 15A and 15B.

An electrical diagram for the ROVBIC 32 is shown in FIG. 16. Note that each of the unit cell schematic diagrams corresponds to the one discussed above with respect to FIG. 14A. Each detector diode cathode 16 connects to a unit cell input circuit, which in this case is the CTIA 32B. The detector anodes 14 all form the p+ common connection, which attaches to the ROVBIC 32 by the ground contact ring 102 shown in FIGS. 15A and 15B.

Also shown in FIG. 16 is a clock generator block 34 that generates the Integrate and Reset timing signals for switches S1 and S2, respectively, and a row shift register block 36 that generates the Row switch S3 timing signals sequentially in a row-by-row manner. The unit cell outputs are input to one of four column amplifiers 38 that in turn feed a chip output amplifier 40 via a column shift register 42. A detector bias generator block 44 includes the Detector Bias DAC 32A and also generates the Detector Bias Common 32C, both shown in FIG. 14A.

A Digital block 46 receives digital signals (clock and data) from an external controller or data processor (not shown), and converts the digital signals into column readout signals that are applied to the column shift register for controlling the outputting of unit cell signals. Another output of the Digital block 46 is applied to the Detector Bias Generator block 44 for setting at least the level of the output of the Detector Bias DAC 32A.

Figure 17:
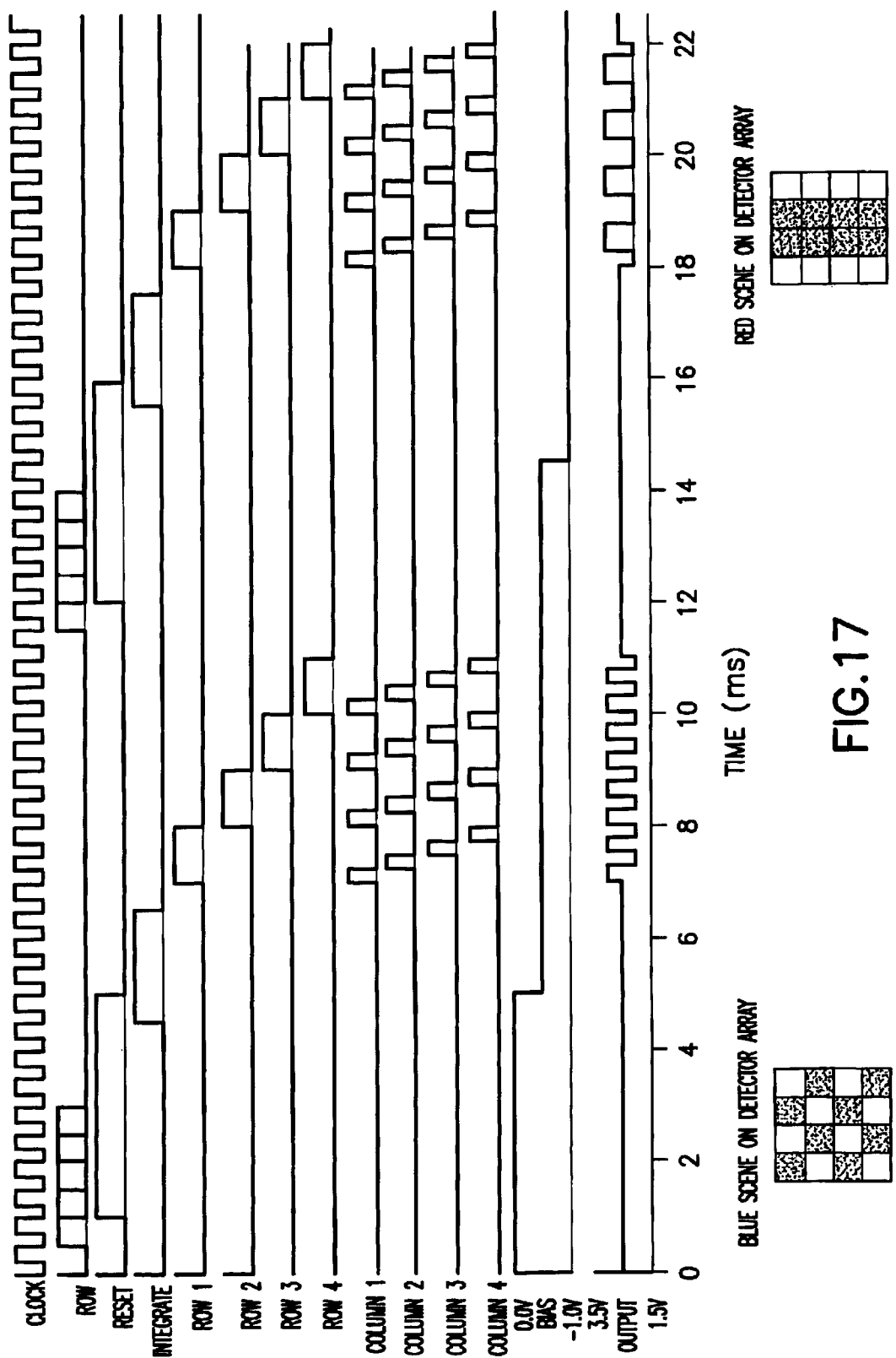
FIG. 17 is an exemplary ROIC unit cell timing diagram.

FIG. 17 shows the timing waveforms for the 4×4 array 100 of FIGS. 15A and 15B, and illustrates the operation of the circuitry shown in FIG. 16. The output of the array 100 (the bottom trace) results in this example from imaging the red and blue scenes shown below the timing diagram. The blue scene is assumed to cover every other pixel, while the red scene is assumed to cover the center two pixel columns of the array 100. The time from the first high pulse on Data to the next high pulse is referred to as a frame; and the exemplary frame period in FIG. 17 is thus 11 ms. The Data may be used to program the Detector Bias DAC 32A, among other necessary functions, as described above. In this illustration the Detector Bias DAC 32A is programmed to provide detector sensitivity to a relatively short wavelength scene in the first frame. In the second frame, the Detector Bias DAC 32A is programmed to provide longer wavelength sensitivity (−0.5 volts versus −1.0 volts, respectively). The Reset and Integrate timing signals, and the Bias voltage, affect all of the detectors 10 on the array 100 simultaneously. After reset and integration, all sixteen unit cell voltages are multiplexed to the single output amplifier 40, producing a video stream of analog voltages. This video stream may then be converted back into a viewable image, and/or it may be processed using any of a number of known types of algorithms such as those that enhance the image, remove artifacts, perform uniformity corrections, and so forth.

Note in this example that the Detector Bias DAC 32A can be programmed during operation, e.g., on a frame-by-frame basis, to provide the desired sensitivity to different wavelength bands.

Note as well that the output of the Detector Bias DAC 32A is shown as being applied in common to all of the unit cells. It is, however, within the scope of these teachings to provide two or more Detector Bias DACs 32A, and suitable selection and multiplexing circuitry, for applying different Detector Bias signals to different photodetectors 10. In this manner, and by example, during a single frame certain ones of the photodetectors 10 are made responsive to a first wavelength band and certain others of the photodetectors 10 are made responsive to a second wavelength band that may or may not completely or partially overlap the first wavelength band.

In addition, and as was discussed above, a smaller AC signal can be superimposed on the DC bias voltage, where the magnitude of the AC signal determines the spectral width of the bandpass. By sweeping the DC bias voltage the spectral bandpass is swept across a range of the IR spectrum. By using a phase sensitive AC detection technique, such as a synchronous detection technique that is phase locked to the phase of the superimposed AC signal, the SNR of the detector 10 can be significantly improved.

While described in the context of exemplary semiconductor materials, dopants, dopant concentrations, layer thicknesses, compositional profiles, wavelengths, bias voltages, circuit embodiments, waveform levels and times, these are intended to be viewed in a non-limiting and exemplary sense, and are not intended to be construed as limiting the scope or practice of the teachings in accordance with this invention.

What is claimed is:

1. A method for operating an array of electromagnetic radiation responsive photodetectors, comprising providing said array such that each photodetector comprises a photodiode having a p-n junction, wherein a wavelength at which a maximum special response of said photodiode occurs is determined at least in part by a magnitude of a reverse bias voltage applied across said p-n junction, where each of said photodiodes comprises a layer of semiconductor material that is compositionally graded from wider bandgap material towards narrower bandgap material in a direction away from said p-n junction, said layer confining substantially all of a depletion region of the photodiode; during operation of said array, establishing for each photodetector a predetermined magnitude of reverse bias voltage; and detecting an electrical signal generated from each photodetector that results from incident electromagnetic radiation having wavelength that correspond to said maximum spectral response that is determined at least in part by the magnitude of said reverse bias voltage.

2. A method as in claim 1, where the step of establishing establishes approximately the same magnitude of reverse bias voltage for each photodetector of the array.

3. A method as in claim 1, where the step of establishing establishes approximately the same magnitude of reverse bias voltage for some of the photodetectors of the array, and establishes at least one different magnitude of reverse bias voltage for other photodetectors of the array.

4. A method as in claim 1, where the step of establishing establishes a different magnitude of reverse bias voltage for each photodetector of the array.

5. A method as in claim 1, where the array is comprised of rows and columns of photodetectors, and where the step of establishing establishes a different magnitude of reverse bias voltage for individual ones of rows or columns of the array.

6. A method as in claim 1, where the step of establishing includes varying the magnitude of the reverse bias voltage during operation of the array.

7. A method as in claim 1, where said layer of semiconductor material is compositionally graded in a stepped fashion, and where increments of reverse bias voltage have a magnitude that is related to said steps.

8. A method as in claim 1, further comprising superimposing an alternating current signal on said reverse bias voltage and using a synchronous detection technique to detect photons corresponding to a certain bandgap energy.

9. A readout integrated circuit for use with an array of radiation responsive bias tunable photodetectors, said readout integrated comprising circuitry for reading out electrical signals generated during an integration period by individual ones of said photodetectors, said readout integrated circuit further comprising at least one variable source of bias voltage having an output coupled to said array of photodetectors and that is controlled so as to set a wavelength sensitivity of said photodetectors, where said at least one variable source of bias potential has a first node coupled to an anode of a photodetector and a second, output node coupled to a first input of an integration amplifier, where the photodetector anode is coupled to a second input of the integration amplifier.

10. A readout integrated circuit as in claim 9, where said integration amplifier comprises a capacitive transimpedance amplifier.

11. A readout integrated circuit for use with an array of radiation responsive bias tunable photodetectors, said readout integrated comprising circuitry for reading out electrical signals generated during an integration period by individual ones of said photodetectors, said readout integrated circuit further comprising at least one variable source of bias voltage having an output coupled to said array of photodetectors and that is controlled so as to set a wavelength sensitivity of said photodetectors, where said photodetector comprises a p-n junction, where a wavelength at which a maximum spectral response of said photodetector occurs is determined at least in part by the magnitude of the bias voltage applied to said p-n junction, and said photodetector comprises a layer of semiconductor material that is compositionally graded from wider bandgap material towards narrower bandgap in a direction away from said p-n junction, said layer confining substantially all of a depletion region.

12. A method for operating an array of electromagnetic radiation responsive photodetectors, comprising providing said array such that each photodetector comprises a photodiode having a p-n junction, wherein a wavelength at which a maximum spectral response of said photodiode occurs is determined at least in part by magnitude of a reverse bias voltage applied across said p-n junction, where each of said photodiodes comprises a layer of semiconductor material that is compositionally graded from wider bandgap material towards narrower bandgap material in a direction away from said p-n junction, said layer confining substantially all of a depletion region of the photodiode; during operation of said array, applying to each photodetector a DC reverse bias voltage that is modulated with an AC component and synchronously detecting an electrical signal generated from each photodetector that results from incident electromagnetic radiation.

13. A method as in claim 12, further comprising varying a magnitude of the DC reverse bias voltage.

\* \* \* \* \*